(12) United States Patent
Mihara

(10) Patent No.: US 6,287,986 B1
(45) Date of Patent: Sep. 11, 2001

(54) SPUTTERING FILM FORMING METHOD, SPUTTERING FILM FORMING EQUIPMENT, AND SEMICONDUCTOR DEVICE MANUFACTURING METHOD

(75) Inventor: Satoru Mihara, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/244,761

(22) Filed: Feb. 5, 1999

(30) Foreign Application Priority Data

Jun. 2, 1998 (JP) .................................................. 10-152749

(51) Int. Cl.$^7$ ....................... H01L 21/4763; H01L 21/31; H01L 21/469
(52) U.S. Cl. ............................ 438/763; 438/649; 438/758
(58) Field of Search .................................... 438/649, 763, 438/758, 475, 454

(56) References Cited

U.S. PATENT DOCUMENTS

| | | | | |
|---|---|---|---|---|
| 5,114,556 | * | 5/1992 | Lamont, Jr. ..................... | 204/192.12 |
| 5,798,029 | * | 8/1998 | Morita ............................ | 204/298.16 |
| 5,902,461 | * | 5/1999 | Xu et al. ......................... | 204/192.12 |
| 5,962,923 | * | 10/1999 | Xu et al. ......................... | 257/774 |
| 5,965,034 | * | 10/1999 | Vinogradov et al. ............ | 216/68 |
| 6,080,445 | * | 6/2000 | Sugiyama et al. ............... | 427/249.7 |
| 6,130,182 | * | 10/2000 | Naeem ............................ | 257/766 |
| 6,136,095 | * | 10/2000 | Xu et al. ......................... | 438/649 |

FOREIGN PATENT DOCUMENTS

| | | |
|---|---|---|
| 0 836 218 | 4/1998 | (EP) . |
| 63-169378 | 7/1988 | (JP) . |
| 5-78835 | 3/1993 | (JP) . |
| 5-331636 | 12/1993 | (JP) . |
| 6-020865 | 1/1994 | (JP) . |
| 7-41944 | 2/1995 | (JP) . |
| 09087835 | 3/1997 | (JP) . |

OTHER PUBLICATIONS

Michael A. Lieberman et al; Principles of Plasma Discharges and Material processing—John Wiley & Sons, Inc.; pp. 160–163.
A. Hasegawa et al; The Influence of RF Bias on Electron Shading Damage; 1996 Dry Process Simposium; pp. 43–48.
K. Suu et al; Compositional Contro in Sputter Deposition and High–Rate Deposition Technique of a Thin Ferroelectric Film; Oyo Butsuri, vol. 65, No. 12; pp. 1248–1252.

* cited by examiner

Primary Examiner—John F. Niebling
Assistant Examiner—Walter L. Lindsay, Jr.
(74) Attorney, Agent, or Firm—Armstrong, Westerman, Hattori, McLeland & Naughton, LLP

(57) ABSTRACT

There is provided an RF sputtering film forming method of forming a compound film having a stable composition by use of stable plasma with a broad process window to thus facilitate composition control of the compound film. In the RF sputtering film forming method, an alternating voltage or alternating current is applied to a part or all of walls positioned on the outside of a space formed between a wafer and a target, or an electron temperature in the plasma is reduced by oscillating the RF power in a pulse fashion, or a sputtering gas is composed of at least one kind of gases of helium, neon, xenon, and krypton, or a minus voltage is applied to a part or all of the walls positioned on the outside of the space formed between the wafer and the target.

19 Claims, 12 Drawing Sheets

SPUTTERING FILM FORMING METHOD, SPUTTERING FILM FORMING EQUIPMENT, AND SEMICONDUCTOR DEVICE MANUFACTURING METHOD

BACKGROUND OF THE INVENTION

1. Field of the Invention

The present invention relates to a sputtering film forming method, a sputtering film forming equipment, and a semiconductor device manufacturing method and, more particularly, an RF (radio frequency) sputtering film forming method, an RF sputtering film forming equipment, and a semiconductor device manufacturing method using the RF sputtering film forming method.

2. Description of the Prior Art

In recent years, semiconductor devices employing new material have been developed. For example, FeRAM (Ferroelectric Random Access Memory) in which information are stored by using its hysteresis characteristic has been known.

In the FeRAM, oxide compound material such as PZT, PLZT, etc. has been known as a dielectric film of a capacitor as a memory device. Also, advanced material which is formed by doping calcium (Ca) or strontium (Sr) into PZT has been known.

PZT is an abbreviation for "lead zirconate titanate (Pb$(Zr_xTi_{1-x})O_3$)". PLZT is lanthanum-added PZT and its chemical expression is $Pb_y(Zr_xTi_{1-x})La_zO_3$.

The sol-gel method and the sputtering method are known to form PZT, PLZT. Both methods have merits and demerits.

In the case of the sol-gel method, it has been difficult to improve device characteristics because of the problem of dust generation and organic component contained in the film.

In the case of the conventional sputtering technique, even though a target can be fabricated uniformly in conformity with composition, sometimes its composition is changed in long use. Also, it has been difficult for the sputtering technique to achieve desired film composition by controlling target composition.

As an approach for controlling an amount of Pb in the PZT film and the PLZT film, a method of growing the PZT film by controlling a substrate potential has been set forth in Patent Application Publication (KOKAI) Hei 5-78835 and Patent Application Publication (KOKAI) Hei 7-41944. In addition, a method of including excessive Pb or Pb oxide at initial growth of the PZT film has been set forth in Patent Application Publication (KOKAI) Hei 5-331638.

Further, a method of controlling an amount of Pb by changing the substrate potential has been described in FIG. 11 of Ohyo Butsuri, vol.65, No.12 (1996), pp.1248–1252.

The above dielectric film materials are mainly composed of oxide material. In case the dielectric film made of oxide is grown by the normal sputtering method, an insulating oxide compound target is employed. The oxide compound target is an electrically insulating target, so that it is impossible to execute the sputtering by applying DC power to the oxide compound target.

Therefore, if the sputtering is carried out by using the insulating oxide compound target, normally the RF sputtering method has been employed.

However, in the RF sputtering method, there has been the problem that discharge state is ready to change in time. This is due to the fact that a discharge potential is changed gradually because a film is grown on a chamber wall of the sputtering equipment.

Besides, if the plasma generated by applying the RF power is changed in time, a plasma potential or an electron temperature in the plasma is also changed to thus cause a change of a self-bias on the wafer. Then, if the self-bias is changed, it becomes very difficult to control composition of the oxide compound formed on the wafer. Especially, in case the PZT film and the PLZT film are to be formed, when an ion energy is made higher on the wafer, Pb is etched selectively on the wafer and an amount of Pb in the film is reduced smaller than a desired amount since Pb has a higher sputtering yield than Zr or Ti.

Therefore, according to the change of the self-bias, an amount of Pb in the PZT film and the PLZT film is changed gradually with the progress of film forming time. If such amount of Pb is changed, variation is caused in electric characteristics of the FeRAM to raise the problem.

For example, the method of growing the PZT film by controlling the substrate potential has been set forth in above Patent Application Publication (KOKAI) Hei 5-78835 an d Patent Application Publication (KOKAI) Hei 7-41944, but it is not expected that an amount of Pb should be controlled freely. In addition, if an electrostatic chuck is attached to the substrate side to improve control of the substrate temperature, film quality control mentioned in the above Publications is made impossible since its resistance value is high such as $1 \times 10^9$ Ωcm to $1 \times 10^{12}$ Ωcm. Furthermore, since the plasma in the chamber is gradually changed in case the insulating film is adhered onto the chamber wall, it is difficult to suppress the variation of Pb if such variation is checked over a long period of time.

In contrast, according to the method of controlling an amount of Pb by changing the substrate potential set forth in FIG. 11 of J. Appl. Phys., vol.65, No.12 (1996), pp.1248–1252, such an event has been described particularly that an amount of Pb can be increased up to 0.5 to 1.1 by inserting a variable resistor between the substrate susceptor and ground.

In this method, the RF current flowing into the substrate is controlled. Such control can be carried out in a device structure in which the RF current is easy to flow into the substrate, but the RF current flowing in the substrate side is reduced to make Pb control difficult if the structure by which the RF current can flow more easily to the chamber wall, etc. exists. In addition, if the electrostatic chuck is attached to the substrate side to improve temperature controllability, a resistance in this portion becomes an issue and Pb control becomes impossible. In other words, if potential of the chamber wall is a floating potential and also the substrate is directly connected to ground via the variable resistor, such approach becomes effective. However, for example, in case the chamber wall is at ground potential and the electrostatic chuck having a high resistance is attached to the substrate, an amount of Pb cannot be controlled, as described above. Moreover, when the film is deposited on the chamber wall, variation of Pb cannot be suppressed over a long period of time.

In the meanwhile, normally the plasma must be confined in the inside of a shield to surround the chamber. However, if the plasma in the chamber becomes unstable, the plasma leaks out of the shield to bring about adhesion of the film on the chamber wall and to cause sudden particle generation. Further, if leakage of the plasma out of the shield is not uniform, variation of film formation distribution on the wafer is generated. Also, in the sputtering equipment using a magnetron, since normally the film is formed by rotating the magnet, deviation of the plasma is ready to occur, which has an influence on the film formation distribution.

Leakage of the plasma out of the shield depends upon size and structure of the shield. The probability to leak out of the shield becomes higher as the pressure is increased higher, whereas the probability to leak out of the shield becomes lower as the pressure is reduced lower.

Accordingly, if process parameters are changed to control an appropriate amount of Pb, because the plasma is easy to flow out to the outside in a high pressure range, distribution of film thickness and film quality tend to become uneven to thus narrow the process window.

In particular, as disclosed in Patent Application Publication (KOKAI) Hei 5-331638, in case excessive Pb or Pb oxide is grown in an initial layer in sputtering film formation, the narrow process window makes it impossible to control an amount of Pb having good distribution by changing the sputtering conditions. This is because, if the film forming conditions are changed, a mode of the plasma is changed and the plasma is easily apt to deviate. In case the sputtering distribution is not good, it becomes impossible to grow only the initial layer in the Pb-excessive state.

As the countermeasure of this, the method of controlling an amount of Pb by changing the substrate potential has been set forth in FIG. 11 of J. Appl. Phys., vol.65, No.12 (1996), pp.1248–1252. But this method has disadvantages described as above.

SUMMARY OF THE INVENTION

It is an object of the present invention to provide a sputtering film forming method of either forming a compound film having a stable composition by use of stable plasma having a broad process window or forming a particle-reduced compound by facilitating composition control of the compound film, a sputtering film forming equipment for embodying the same, and a semiconductor device manufacturing method using the sputtering film forming method.

The above object can be achieved by a sputtering film forming method which comprises the steps of opposing a target at a distance to a wafer loaded on a susceptor in a chamber; reducing a pressure in the chamber; applying an RF power to the target; introducing a sputtering gas into the chamber; and depositing target constituting material on the wafer, whereby a film is formed on the wafer; wherein an alternating voltage is applied to a part or all of the wall positioned on an outside of a space formed between the wafer and the target.

A sputtering film forming equipment for embodying the above method is characterized by comprising a wafer loading table placed in a chamber; a target positioned to oppose at a distance to the wafer loading table in the chamber; an RF power supply for supplying an RF power to the target; a gas supply source for introducing a sputtering gas into the chamber; walls to for surrounding a space between the wafer loading table and the target; and an electricity applying source for applying an alternating voltage to a part or all of the walls.

The above object can be achieved by a sputtering film forming method which comprises the steps of opposing a target at a distance to a wafer loaded on a susceptor in a chamber; reducing a pressure in the chamber; generating a plasma between the wafer and the target by applying an RF power to the target; introducing a sputtering gas into the chamber; and depositing target constituting material on the wafer, whereby a film is formed on the wafer; wherein an electron temperature in the plasma is reduced by pulse-modulating the RF power.

A sputtering film forming equipment for embodying the above method is characterized by comprising a wafer loading table placed in a chamber; a target positioned to oppose at a distance to the wafer loading table in the chamber; an RF power supply for supplying an RF power to the target; a gas supply source for introducing a sputtering gas into the chamber; walls for surrounding a space between the wafer loading table and the target; and a modulation circuit for pulse-generating the RF power.

The above object can be achieved by a sputtering film forming method which comprises the steps of opposing a target at a distance to a wafer loaded on a susceptor in a chamber; reducing a pressure in the chamber; generating a plasma between the wafer and the target by applying an RF power to the target; introducing a sputtering gas into the chamber; and depositing target constituting material on the wafer, whereby a film is formed on the wafer; wherein the sputtering gas is composed of either at least one kind of gases of helium, neon, xenon, and krypton, or a gas in which at least one kind of gases of helium, neon, xenon, and krypton is mixed selectively into an argon gas.

A sputtering film forming equipment for embodying the above method is characterized by comprising a wafer loading table placed in a chamber; a target positioned to oppose at a distance to the wafer loading table in the chamber; an RF power supply for supplying an RF power to the target; conductive walls for surrounding a space between the wafer loading table and the target; and gas supplying sources, for supplying either at least one kind of gases of helium, neon, xenon, and krypton, or a gas in which at least one kind of gases of helium, neon, xenon, and krypton is mixed selectively into an argon gas, into the chamber.

The above object can be achieved by a sputtering film forming method which comprises the steps of opposing a target at a distance to a wafer loaded on a susceptor in a chamber; reducing a pressure in the chamber; generating a plasma between the wafer and the target by applying an RF power to the target; introducing a sputtering gas into the chamber; and depositing target constituting material on the wafer, whereby a film is formed on the wafer; wherein a minus voltage is applied to a part or all of walls positioned around a space formed between the wafer and the target.

A sputtering film forming equipment for embodying the above method is characterized by comprising a wafer loading table placed in a chamber; a target positioned to oppose at a distance to the wafer loading table in the chamber; an RF power supply for supplying an RF power to the target; a gas supply source for introducing a sputtering gas into the chamber; walls for surrounding a space between the wafer loading table and the target; and a voltage supplying source for applying a minus voltage to a part or all of the walls.

The above object can be achieved by a semiconductor device manufacturing method which comprises the steps of opposing a target at a distance to a semiconductor wafer loaded on a susceptor in a chamber; reducing a pressure in the chamber and then applying an RF power to the target; introducing a sputtering gas into the chamber; applying an alternating voltage to a part or all of the walls positioned on an outside of a space formed between the semiconductor wafer and the target; and forming a film on the wafer by depositing material for constituting the target on the semiconductor wafer.

In the event that the insulating target is RF-sputtered, the insulating deposition film is deposited gradually to the chamber or the walls of the shields, whereby the plasma is changed gradually.

The RF current flowing through the walls is reduced with the lapse of a film growing time, and then the RF current starts to flow into the wafer side. This is due to the fact that the plasma state is changed and the plasma potential and the electron temperature are changed gradually.

When the plasma potential and the electron temperature are changed, the wafer potential Ew can be expressed by the following Eq.(1). Where the wall potential is deemed as the wafer potential if the wafer is in a floating potential.

$$Ew=-Te*ln(M/2\pi m) \qquad (1)$$

Where Te is electron temperature, M is mass of the ion, and m is mass of the electron. In the case of Ar plasma, the mass M is 40.

According to Eq.(1), it is understood that the wafer potential is considerably affected by the electron temperature. The energy of ion is a value decided by a difference between the plasma potential and the wafer potential. Based on the above, it is possible to say that the energy of ion is greatly affected by the plasma potential and the electron temperature.

Now let's discuss the case where the dielectric film (insulating film) such as PZT, PLZT, etc. is grown by the sputtering on the wafer. With the lapse of the film growing time, the insulating deposition film is deposited onto the walls to rise the plasma potential. Then, the electron temperature is also influenced by change in the plasma potential.

According to the change in the plasma potential, the wafer attacking energy is changed from a clean state of the chamber over a long period of time. Such change is increased as the sputtering accumulated time is increased.

Based on the above, it is understood that, if the dielectric film such as PZT, PLZT, etc. is tried to form by the sputtering, the Pb amount in the PZT film or the PLZT film on the wafer is gradually reduced by the influence of Pb oxide having the high sputtering yield with lapse of the film forming time if checked over the long period of time.

In order to prevent such phenomenon, the present invention has employed following means.

(i) First, it is effective in control of an amount of the elements in the film grown by the sputtering to change the plasma generated in the chamber by applying the alternating voltage to a part of the chamber or the shields.

If the plasma in the chamber is changed by applying the alternating power to the chamber or the walls of the shields, change in the plasma potential and the electron temperature on the wafer can be reduced. As a result, both the wafer potential and the RF current flowing into the wafer can be kept constant.

Accordingly, if the film such as PZT, PLZT, etc. is formed by the sputtering, the above can contribute to stabilization of the Pb amount in the film over the long period of time. In addition, since Pb can be returned to the plasma by applying the alternating power to the walls to attack Pb attached to the walls, such control can be attained that the Pb composition in the film on the wafer can be increased in excess of the Pb composition in the target.

Advantages can be achieved sufficiently by the method in which the alternating voltage to be applied to the walls is applied in the pulse fashion.

According to this method, since the peak energy of the ion can be controlled if the alternating voltage is shaped into a pulse, the sputtering amount from the walls can be changed to enable the Pb amount control more freely.

From the same reason, since the plasma can be changed if the rectangular waveform which is obtained as pulsed DC voltage is applied to the wall, the Pb amount in the film can be controlled.

In the present invention, the Pb amount can be controlled by changing the plasma, in place of the method of executing directly potential control of the substrate as described in the Publications. Also, in above Ohyo Butsuri, vol.65, No.12 (1996), pp.1248–1252, it has been impossible to increase the Pb amount in excess of the Pb composition in the target. However, in the present invention has the advantage that Pb can be increased to exceed the Pb composition in the target. In addition, if the electrostatic chuck is employed, the present invention can provide an effective means for improving Pb controllability.

As for the frequency of the alternating voltage to be applied to the walls, 1 MHz or less is desired not to apply the self-bias. If the high frequency range of more than 1 MHz is applied, discharge is caused easily in the space between the chamber wall and the shields of the sputtering equipment, and hence the deposition film is deposited to places other than the shields. Therefore, such high frequency range of more than 1 MHz is not preferable. In contrast, if the frequency is too low, no effect can be expected since the charge-up on the walls becomes an issue. For this reason, the frequency range from 50 Hz to 1 MHz is desired. This optimal frequency is due to the space in the equipment and the gas pressure conditions.

The change in the wall potential for the long period of time can be detected by monitoring the line current when the alternating or rectangular waveform is applied, and therefore such monitoring is available to detect the cleaning time or treat uncertain troubles.

(ii) When the electron temperature in above Eq.(1) is lowered, the wafer potential is hard affected by the walls. The wafer potential can be made small, i.e., the energy of the ions which are implanted into the wafer can be reduced, by lowering the electron temperature further. As a result, composition control of respective elements in the wafer is made easy.

As described in A. Hasegawa et al., Proc. Symp, Dry. Process, 43 (1996), to generate the pulse discharge plasma can be thought of as a means for reducing the electron temperature.

If this technique is applied to the RF pulse sputtering, film quality control of the PZT film and the PLZT film can be further facilitated.

The pulse discharge plasma can be obtained by AM-converting the RF power applied to the target, for example.

(iii) Furthermore, in the control to reduce the Pb amount in the film formed on the wafer, the Pb amount can be controlled by applying the RF bias to the wafer. However, in the control to increase the Pb amount in the film, application of the bias to the wafer is not available since the film is insulative. Accordingly, the electron temperature and the plasma potential in the plasma must be changed. As one approach, there is a method of changing type of the gas.

As described in Eq.(1), the wafer potential can be lowered as the mass of ion becomes smaller. Hence, if the mass is changed by adding He or Ne, the energy of ions flowing into the wafer can be decreased, so that the control to increase the Pb amount can be implemented.

On the other hand, it is needless to say that the control to reduce the Pb amount can be implemented by adding a heavy rare gas such as Kr, Xe, etc., in addition to application of the bias to the wafer. According to this fact, without considerable change in the sputtering conditions, the Pb amount can be controlled by changing the type of the gas.

(iv) As already described above, when the insulating target is RF-sputtered, the insulating deposition film is deposited gradually on the chamber or the walls of the shields to change the plasma. Therefore, the plasma becomes unstable and thus such a phenomenon appears that the plasma leaks out to the outside of the shields.

Therefore, it has been conformed experimentally that, if the minus DC voltage is applied to the chamber or the walls of the shields, the plasma can be confined in the inside of the shields. For this reason, it has been found that the mode of the plasma is changed and thus generation of dust being released from the walls can be suppressed. In this manner, since the plasma can be confined in the inside of the shields, no problem has arisen especially even when the Pb amount in the PZT film or the PLZT film is controlled by changing the RF power applied to the target.

DESCRIPTION OF THE PREFERRED EMBODIMENTS

Therefore, embodiments of the present invention will be explained in detail with reference to the accompanying drawings hereinafter.

(First Embodiment)

Figure 1:
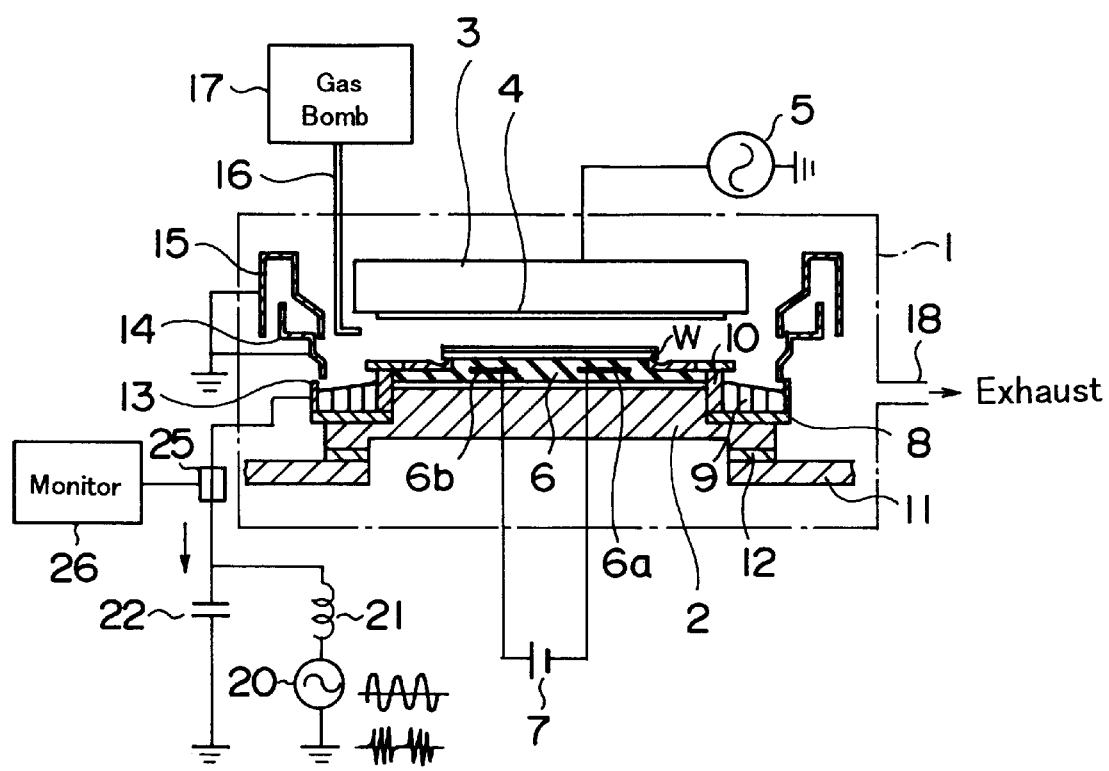
FIG. 1 is a view showing a configuration of an RF sputtering film forming equipment according to a first embodiment of the present invention.

FIG. 1 is a view showing a configuration of an RF sputtering film forming equipment according to a first embodiment of the present invention.

In FIG. 1, a conductive wafer loading table (susceptor) 2 on which a semiconductor wafer W is loaded and a target supporting portion 3 are arranged to oppose at a distance to each other in a sputtering chamber 1. A target 4 of 5 to 6 mm thickness is adhered to a bottom surface of the target supporting portion 3 so as to face to the semiconductor wafer W. The target 4 is composed of material constituting the dielectric film such as PZT, PLZT, for example.

Also, the target supporting portion 3 is composed of conductive material such as copper, for example, and connected to an RF power supply 5.

An electrostatic chuck (electrostatic sticking) 6 in which a first electrode 6a and a second electrode 6b are buried in an insulating material at a distance along the lateral direction is fitted on a top surface of the wafer loading table 2 to be positioned below the target supporting portion 3 by a distance of about 40 to 60 mm. A plus electrode and a minus electrode of a direct current power supply 7 are connected the first electrode 6a and the second electrode 6b respectively, whereby the semiconductor wafer W is electrostatically sticked to the electrostatic chuck 6. The electrostatic sticking 6 has a volume resistance of $1 \times 10^9$ $\Omega$cm to $9 \times 10^{12}$ $\Omega$cm.

Also, a stepped portion is formed on an outer periphery of the wafer loading table 2, and then a conductive frame 9 is loaded on the stepped portion via a first insulating film 8. The electrostatic chuck 6 is displaced on the inside of the conductive frame 9 via an insulating frame 10. Accordingly, the conductive frame 9 is isolated electrically from the electrostatic chuck 6 and the wafer loading table 2. In addition, the wafer loading table 2 is in an electrically floating state because it is isolated from a conductive base 11 positioned below the wafer loading table 2 via a second insulating film 12.

A number of through holes formed in the film thickness direction are provided within the outer conductive frame 9 of the electrostatic chuck 6. A first shield 13 which is formed as a conductive frame shape is fitted onto an outer peripheral surface of the outer conductive frame 9.

Second and third shields 14, 15 which are formed as a conductive frame shape respectively are arranged over the first shield 13. The first, second, and third shields 13, 14, 15 are arranged in the vertical direction so as not to come into contact and to surround a space between the wafer loading table 2 and the target 4 and its periphery externally.

A gas bomb 17 in which an inert gas such as helium (He), neon (Ne), argon (Ar), krypton (Kr), or xenon (Xe) is sealed and connected to a gas introducing pipe 16 being connected to the sputtering chamber 1. An exhaust pump (not shown) is also connected to an exhaust port 18 of the sputtering chamber 1.

A configuration of the RF sputtering film forming equipment as constructed above is commonly employed in other embodiments to be described later.

In the RF sputtering film forming equipment as constructed above, as shown in FIG. 1, a series-connected an alternating bias power supply 20, which generates a sinusoidal wave of a frequency of 50 Hz to 1 MHz, and a coil 21 of 10 mH are connected in parallel with a capacitor 22 of 0.1 $\mu$F between the first frame-like shield 13 and ground. The second and third shields 14, 15 are grounded.

Figure 2:
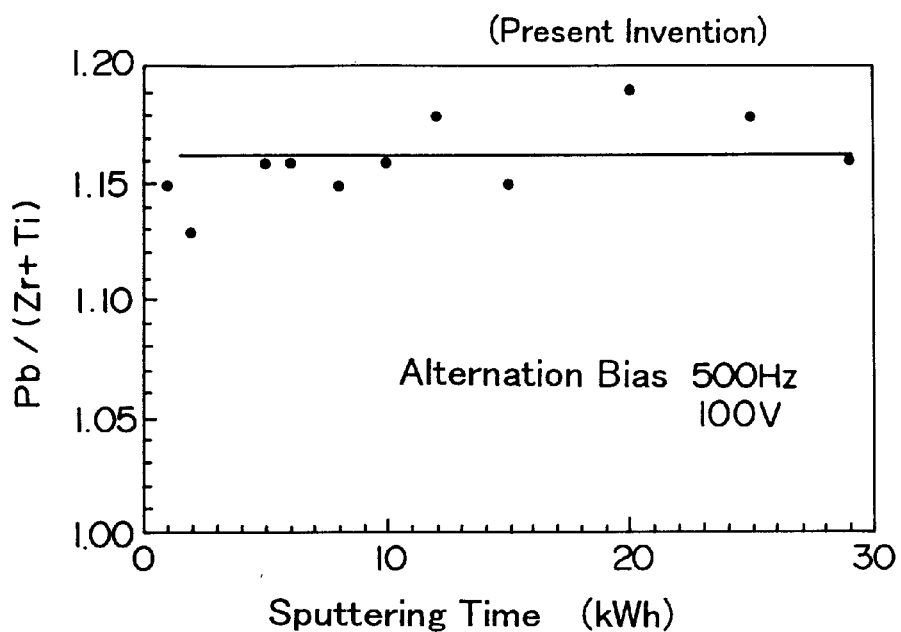
FIG. 2 is a view showing a relationship between a sputtering time and a lead containing rate in a lead oxide compound formed by using the RF sputtering film forming equipment according to the first embodiment of the present invention.

After the PLZT film has been grown on the semiconductor wafer W by use of such RF sputtering film forming equipment and then a relationship between a sputtering time and a rate of a number of Pb atoms relative to a total number of Zr and Ti atoms in the PLZT film has been examined, the result shown in FIG. 2 has been derived.

Material of the target 4 used to form the PLZT film is Pb, Zr, Ti and La, wherein Pb, Zr, Ti, and La are contained at the rates of 1.1, 0.3, 0.7, and 0.02 respectively. As the inert gas supplied from the gas bomb 17, an Ar gas is introduced into the sputtering chamber 1 through the gas introducing pipe 16 at a flow rate of 30 sccm. An exhaust amount from the exhaust port 18 is adjusted such that a pressure in the sputtering chamber 1 becomes 1.0 pascal (Pa). Further, a power of the RF power supply 5 is set to 1.75 kW and a frequency thereof is set to 13.56 MHz. Furthermore, a frequency and a voltage of the output of the alternating bias electrode 20 are set to 500 Hz and 100 V respectively.

Figure 3:
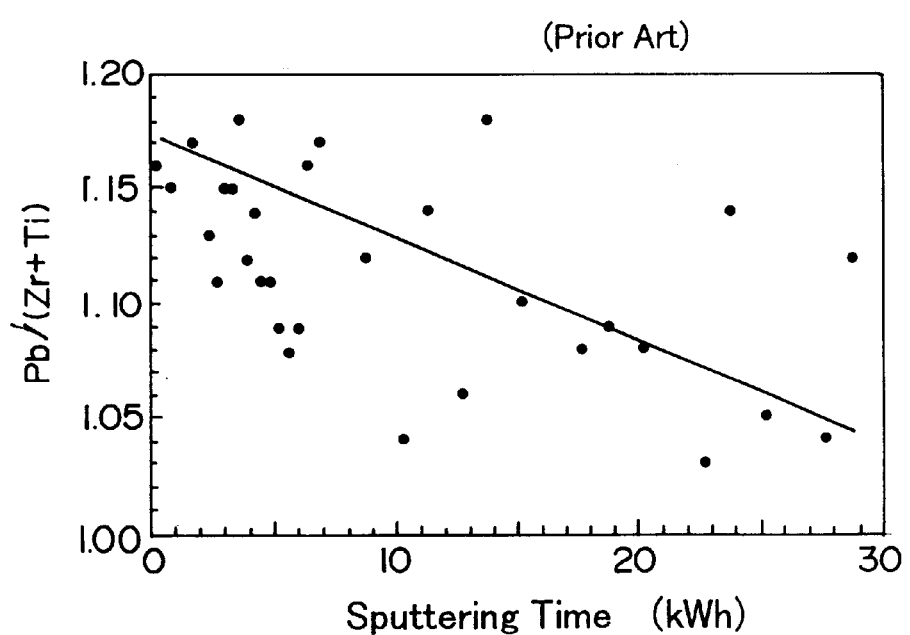
FIG. 3 is a view showing a relationship between a sputtering time and a lead containing rate in a lead oxide compound formed by using the RF sputtering film forming equipment in the prior art.

On the contrary, when a relationship between a sputtering time and a rate of a total number of Pb atoms relative to a total number of Zr and Ti atoms in the PLZT film has been examined by using the RF sputtering film forming equipment in the prior art, in which the first shield 13, is grounded directly without, the alternating bias power supply 20, the coil 21, the capacitor 22, the result shown in FIG. 3 has been derived. The RF sputtering conditions in the prior art are set identical to those set in the first embodiment other than that the first shield 13 is grounded.

By comparing the result in FIG. 2 derived according to the first embodiment with the result in FIG. 3 derived in the prior art, it has been found that, if the alternating bias voltage is applied to the first shield 13 as in the first embodiment, composition of the PLZT film becomes stable and an amount of Pb is increased slightly rather than the conventional equipment.

In this manner, the reason for the event that an amount of Pb is stabilized and increased slightly if the alternating bias voltage is applied to the first shield 13 is that Pb missing from the PLZT film on the semiconductor wafer W can be prevented since Ar ions collide with surfaces of the conductive frame 9 and the first shield 13 to suppress the growth of PLZT thereon, Pb is selectively etched from PLZT, which is adhered to the surfaces of the conductive frame 9 and the first shield 13, by enhancing an ion energy on the conductive frame 9 and the first shield 13 to be returned into the plasma space. As a result, since the deposition film can be prevented from being formed on the surfaces of the conductive frame 9 and the first shield 13, the plasma is difficult to change. Thus, increase in the RF current flowing through the conductive frame 9 and the first shield 13 can be prevented and also increase in the energy for attacking the semiconductor wafer W can be prevented.

Figure 4:
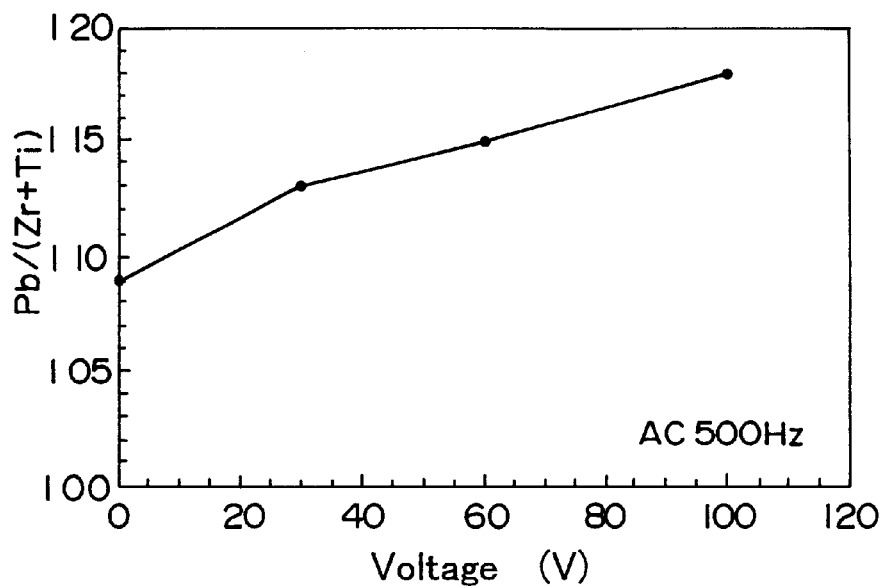
FIG. 4 is a view showing a relationship between a voltage applied to a shield and a lead containing rate in a lead oxide compound formed by using the RF sputtering film forming equipment according to the first embodiment of the present invention.

Next, if magnitude of an output voltage of the alternating bias power supply 20 is changed, a relationship between the voltage applied to the shield and a lead containing rate in a lead oxide compound formed by using the RF sputtering film forming equipment according to the first embodiment of the present invention, as shown in FIG. 4, has been derived. It has been found that an amount of Pb can be controlled to be increased with the increase of the output voltage.

Figure 5:
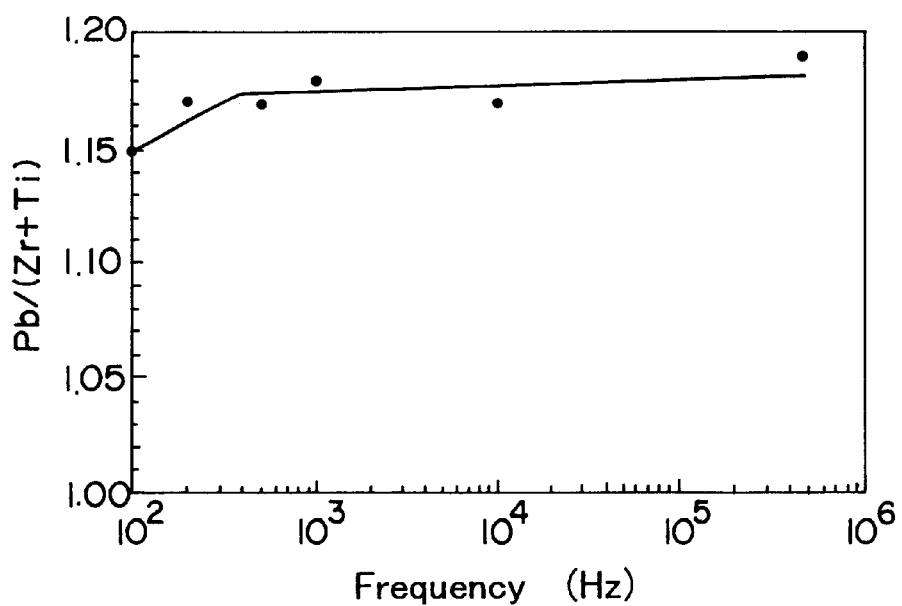
FIG. 5 is a view showing a relationship between a frequency of the voltage applied to the shield and the lead containing rate in the lead oxide compound formed by using the RF sputtering film forming equipment according to the first embodiment of the present invention.

Then, as the result that the output frequency of the alternating bias power supply 20 is changed from 50 Hz to 460 kHz, an amount of Pb has been changed as shown in FIG. 5. It has been confirmed that there is no dependency of the Pb content on the frequency in such range. When the frequency is changed, peak-to-peak voltage is adjusted to 280 V. Therefore, it has been understood that to change the frequency in such range has scarcely an influence on the growth of the PLZT film.

However, since the discharge easily occurs in the space between the shields 13 to 15 of the sputtering equipment and the chamber 1 and therefore the deposition film is adhered to places other than the shields 13 to 15, the alternating bias in excess of 1 MHz is not preferable. In contrast, since charge-up on the wall of the chamber 1 becomes an issue, the alternating bias of excessively low frequency, e.g., less than 50 Hz is not preferable.

The optimal frequency is due to the space and the gas pressure in the equipment and is then determined in the range of 50 Hz to 1 MHz.

The amount of Pb in FIGS. 2 to 5 has been measured by an ICP (Inductively Coupled Plasma) emission spectrochemical analysis.

(Second Embodiment)

Figure 6:
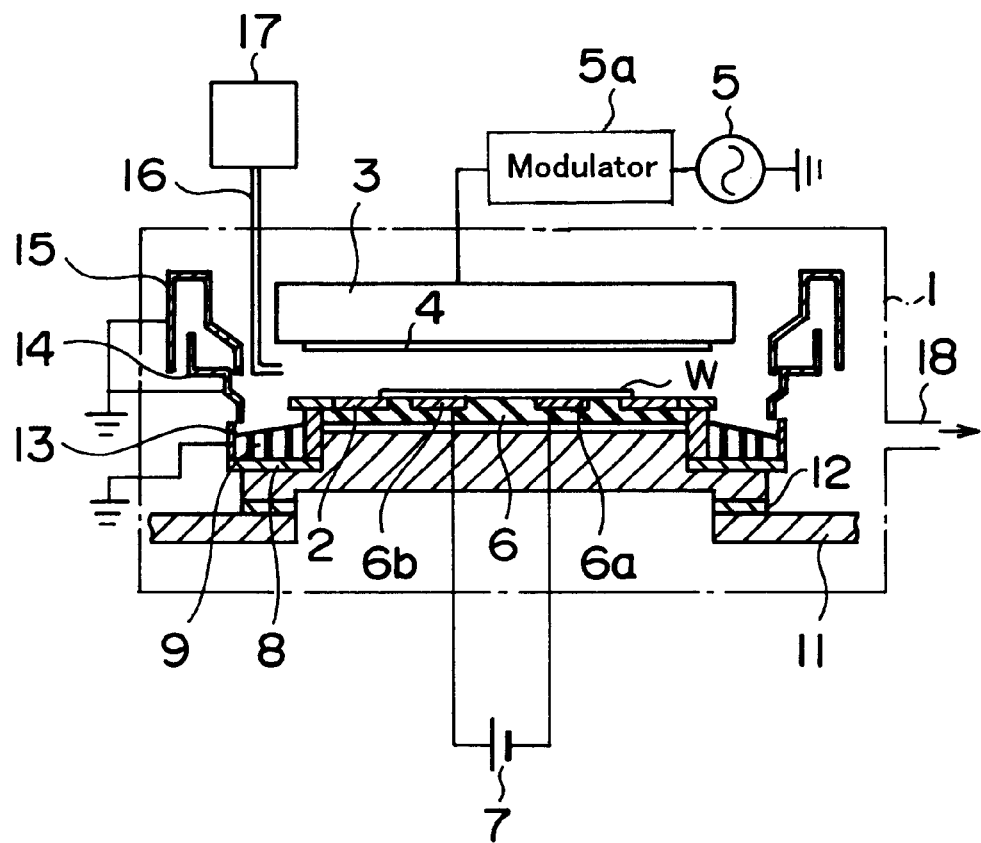
FIG. 6 is a view showing a configuration of an RF sputtering film forming equipment according to a second embodiment of the present invention.

FIG. 6 is a view showing a configuration of an RF sputtering film forming equipment according to a second embodiment of the present invention.

Figure 7:
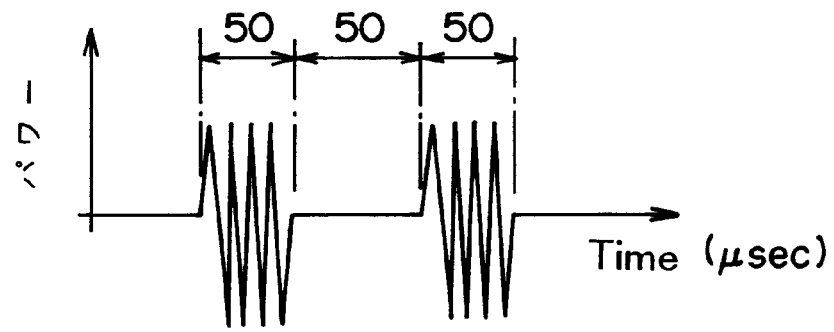
FIG. 7 is a waveform diagram showing a waveform of RF power applied to a target in the RF sputtering film forming equipment according to the second embodiment of the present invention.

In the RF sputtering film forming equipment, the first shield 13 is directly grounded without an alternating bias power supply, a capacitor, and an inductor, and an output from the RF power supply 5 to be applied to the target supporting portion 3 is pulse-modulated by a modulator 5a, as shown in FIG. 7, and has a period of a 50 µsec ON cycle and a 50 µsec OFF cycle. In the ON state, the output frequency is set to 13.56 MHz and a power is set to 1.50 kW.

Material of the target 4 used in the RF sputtering is Pb, Zr, Ti and La, wherein Pb, Zr, Ti, and La are contained at the rates of 1.1, 0.3, 0.7, and 0.02 respectively. The gas introduced into the sputtering chamber 1 is the Ar gas, and also composition of the target and other conditions for sputtering are set similarly to those in the first embodiment.

In FIG. 6, the same symbols as in FIG. 1 refer to the same elements.

Figure 8:
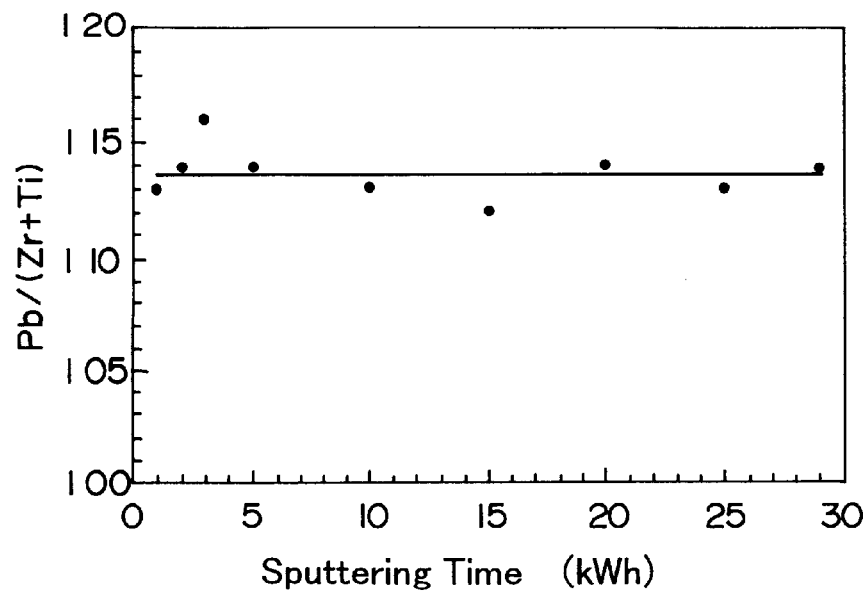
FIG. 8 is a view showing a relationship between a sputtering time and a lead containing rate in a lead oxide compound formed by using the target in the RF sputtering film forming equipment according to the second embodiment of the present invention.

According to the above sputtering conditions, the PLZT film has been formed on the semiconductor wafer loaded on the wafer loading table 2. Then, when a relationship between a sputtering time and a rate of a number of Pb atoms relative to a total number of Zr and Ti atoms in the PLZT film has been checked, the result shown in FIG. 8 has been derived. It has been found that the amount of Pb is kept constant and is increased slightly rather than the RF sputtering film forming equipment in the prior art.

In this case, the amount of Pb has been measured by the IPC emission spectrochemical analysis.

In this way, if the RF power to be applied in the sputtering is formed in a pulse fashion, an electron temperature in the plasma can be lowered and a potential on the semiconductor wafer W can be reduced. In other words, energy of the ion implanted into the semiconductor wafer W can be reduced. Accordingly, composition control of the PLZT film can be facilitated.

(Third Embodiment)

Figure 9:
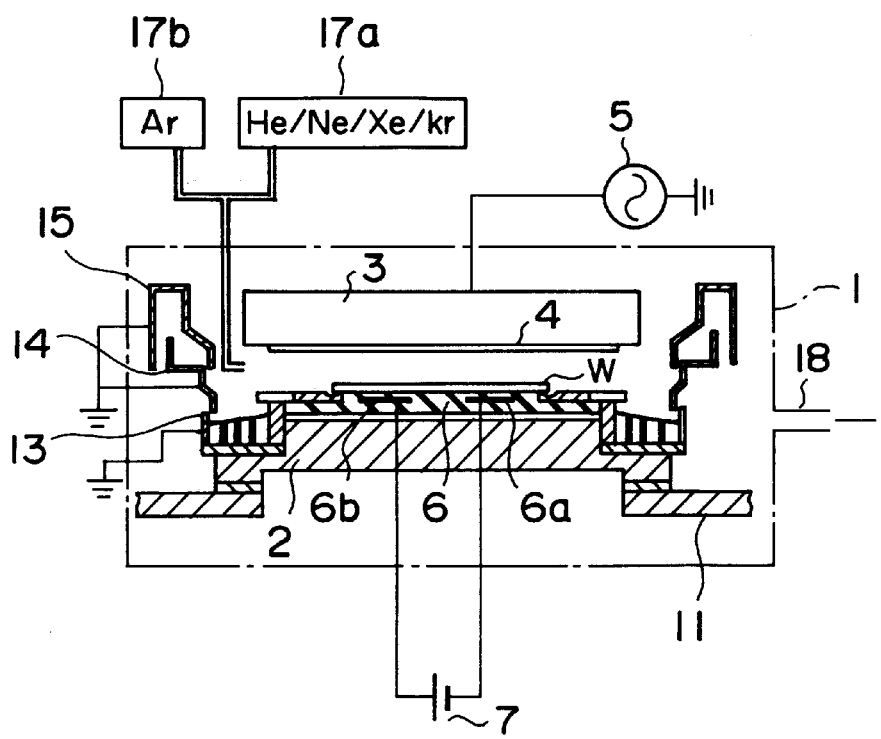
FIG. 9 is a view showing a configuration of an RF sputtering film forming equipment according to a third embodiment of the present invention.

FIG. 9 is a view showing a configuration of an RF sputtering film forming equipment according to a third embodiment of the present invention.

In the RF sputtering film forming equipment, the first shield 13 is directly grounded without an alternating bias power supply, a capacitor, and an inductor. The PLZT film is formed on the semiconductor wafer W by introducing one type of helium (He), neon (Ne), krypton (Kr), and xenon (Xe) from a first gas bomb 17a and introducing argon (Ar) from a second gas bomb 17b into the sputtering chamber 1.

In this case, a flow rate of the argon (Ar) gas is set to 15 sccm and a flow rate of one of helium (He), neon (Ne), krypton (Kr), and xenon (Xe) is set to 15 sccm. The composition of the target 4 and other film forming conditions are set identical to those in the first embodiment.

Figure 10:
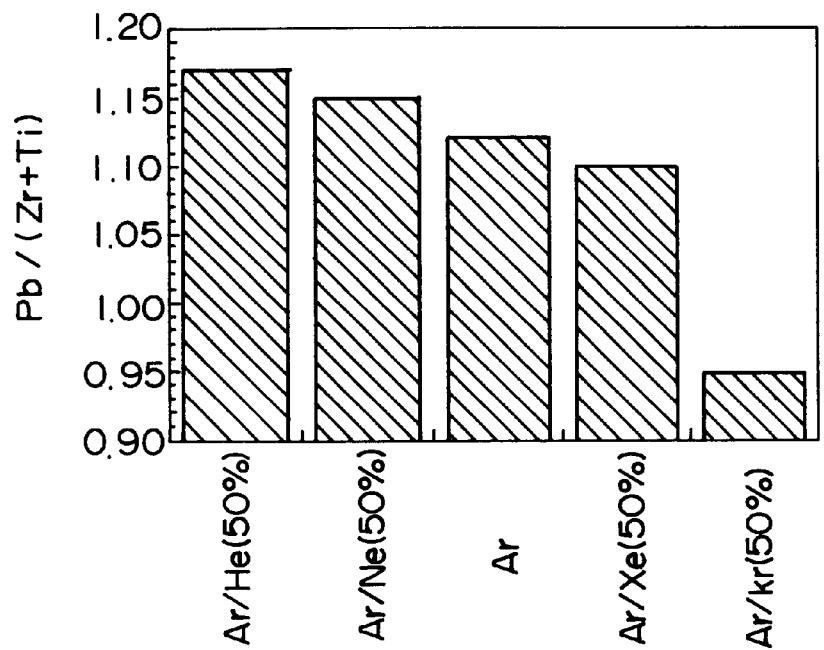
FIG. 10 is a view showing difference in lead containing rates in the lead oxide compound owing to difference in type of gases introduced into a chamber of the RF sputtering film forming equipment according to the third embodiment of the present invention.

According to the above, as shown in FIG. 10, it has been found that the Pb content is differentiated in caused according to difference in the gas type. More particularly, it has been understood that the Pb content can be reduced up to 1.15 to 0.90 in the order of helium (He), neon (Ne), argon (Ar), xenon (Xe), and krypton (Kr).

With the above, it has been detected that the Pb content in the PLZT film can be controlled by selecting the gas type.

Then, with the use of the RF sputtering film forming equipment shown in FIG. 1, the argon gas and the helium gas are introduced into the sputtering chamber 1 at flow rates of 15 sccm and 15 sccm respectively. The composition of the target and other film forming conditions are set identical to those in the first embodiment.

Figure 11:
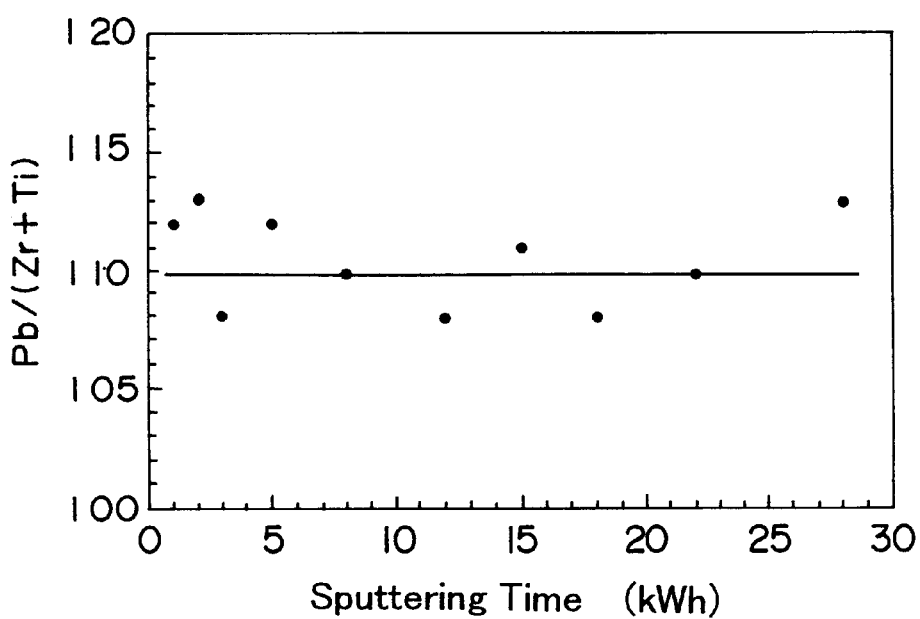
FIG. 11 is a view showing a relationship between a sputtering time and a lead containing rate in a lead oxide compound in case the lead oxide compound film is formed by introducing a helium gas and an argon gas into the chamber of the RF sputtering film forming equipment according to the third embodiment of the present invention.

Under such conditions, when a relationship between a sputtering time and a rate of a total number of Pb atoms relative to a total number of Zr and Ti atoms in the PLZT film has been checked, the result shown in FIG. 11 has been derived. It has been found that the amount of Pb is stable but the Pb content can be reduced in contrast to the case shown in FIG. 2.

In this case, the amount of Pb has been measured by the IPC emission spectrochemical analysis.

(Fourth Embodiment)

Figure 12:
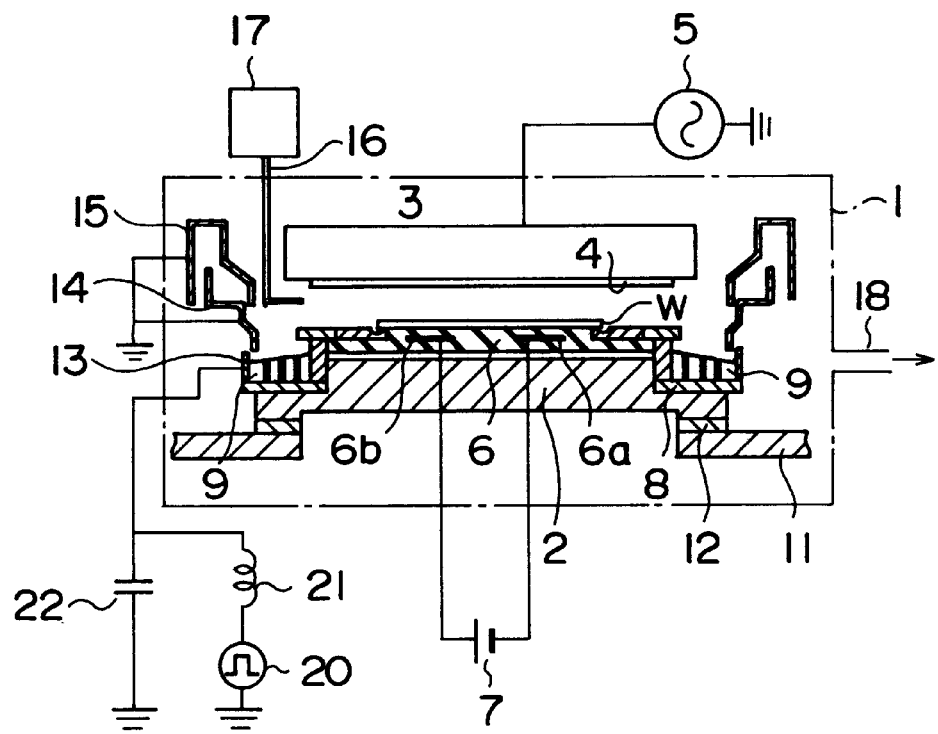
FIG. 12 is a view showing a configuration of an RF sputtering film forming equipment according to a fourth embodiment of the present invention.

FIG. 12 is a view showing a configuration of an RF sputtering film forming equipment according to a fourth embodiment of the present invention.

Figure 13:
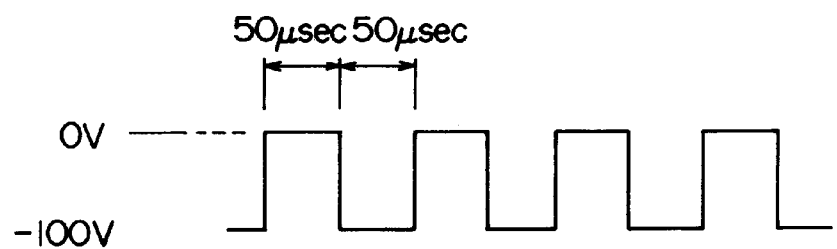
FIG. 13 is a waveform diagram showing a pulse voltage applied to an shield which surrounds a space between a wafer and a target in the RF sputtering film forming equipment according to the fourth embodiment of the present invention.

In the RF sputtering film forming equipment, an output waveform of the alternating bias power supply 20 applied to the first shield 13 shown in FIG. 1 is formed as a rectangular pulse wave shown in FIG. 13.

Under the conditions that a pulse width is set to 50 µsec, a pulse spacing is set to 50 µsec, and a peak value is set to −100 V, and other film forming conditions are set to be identical to those in the first embodiment, the PLZT film has been grown on the semiconductor wafer W. When a relationship between the sputtering time and the Pb content in the PLZT film has been examined, the result shown in FIG. 14 has been derived.

Figure 14:
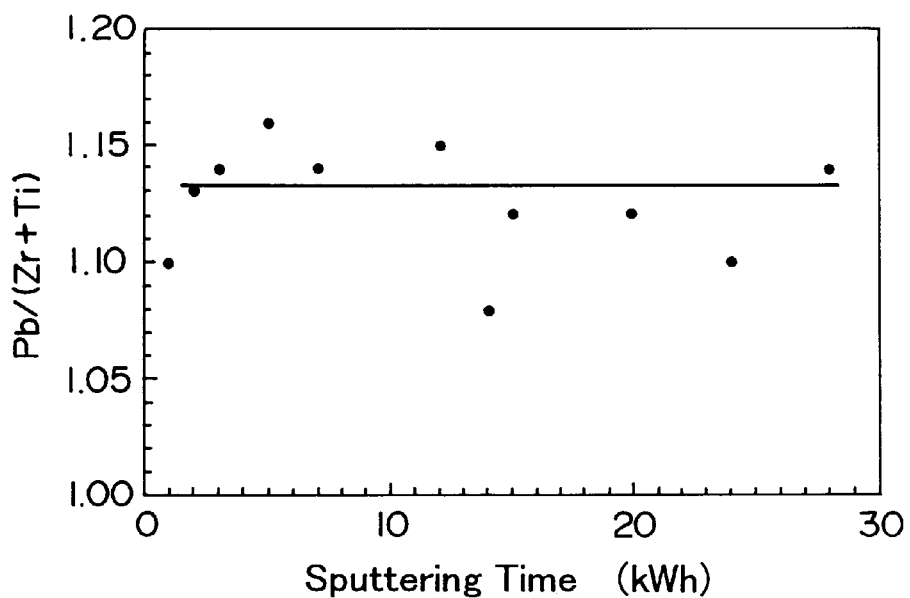
FIG. 14 is a view showing a relationship between a sputtering time and a lead containing rate in a lead oxide compound formed by using the RF sputtering film forming equipment according to the fourth embodiment of the present invention.

From FIG. 14, it has been deduced that the Pb content is kept constant but reduced smaller than the case shown in FIG. 2.

(Fifth Embodiment)

Figure 15:
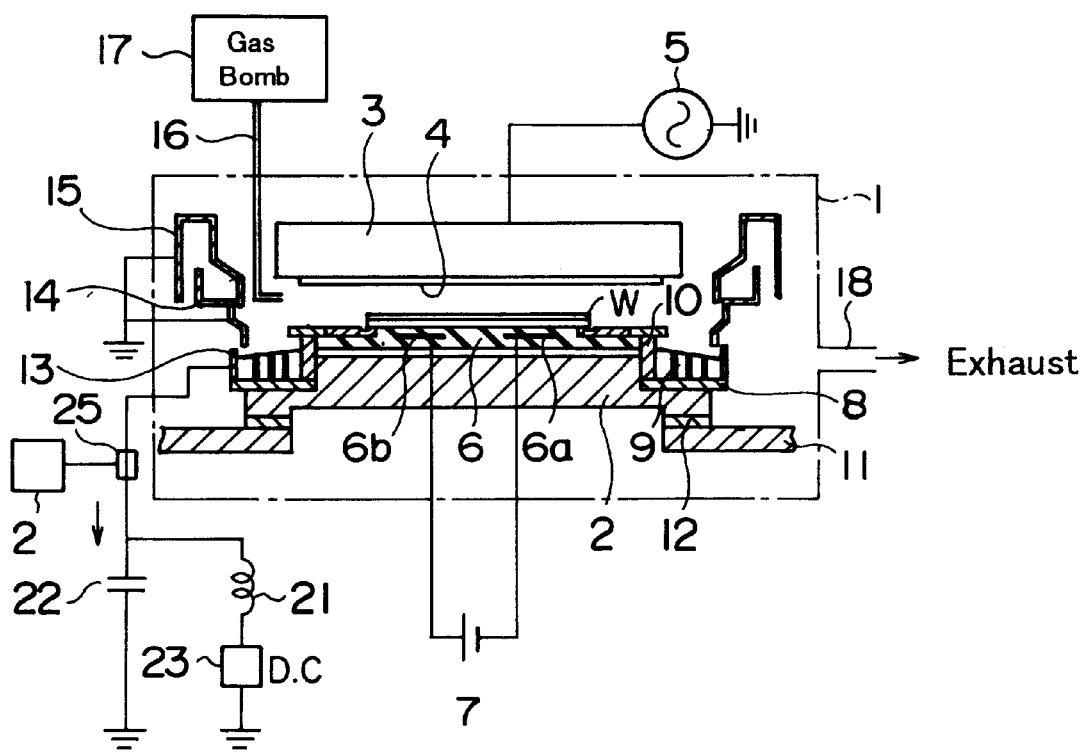
FIG. 15 is a view showing a configuration of an RF sputtering film forming equipment according to a fifth embodiment of the present invention.

FIG. 15 is a view showing a configuration of an RF sputtering film forming equipment according to a fifth embodiment of the present invention.

In the RF sputtering film forming equipment, a direct current bias power supply 23 is employed in place of the alternating bias power supply 20 for applying the voltage to the first shield 13 shown in FIG. 1. The composition of the target 4 and other configurations are set identical to those shown in FIG. 1. In this case, the semiconductor wafer W is in the floating potential state.

As the result of that the DC voltage is applied to the first shield 13 by changing an output voltage of the direct current bias power supply 23 by using the RF sputtering film forming equipment, it has been found that the plasma leaked out to the outside of the shield is not changed in the plus voltage range and also the plasma becomes further stable if the voltage is largely increased to the plus side. On the contrary, it has been recognized that, if the voltage is applied to the minus side, the plasma which is normally leaked out to the outside of the shields can be confined in the shields 13 to 15 in the range smaller than −50 V.

Figure 16:
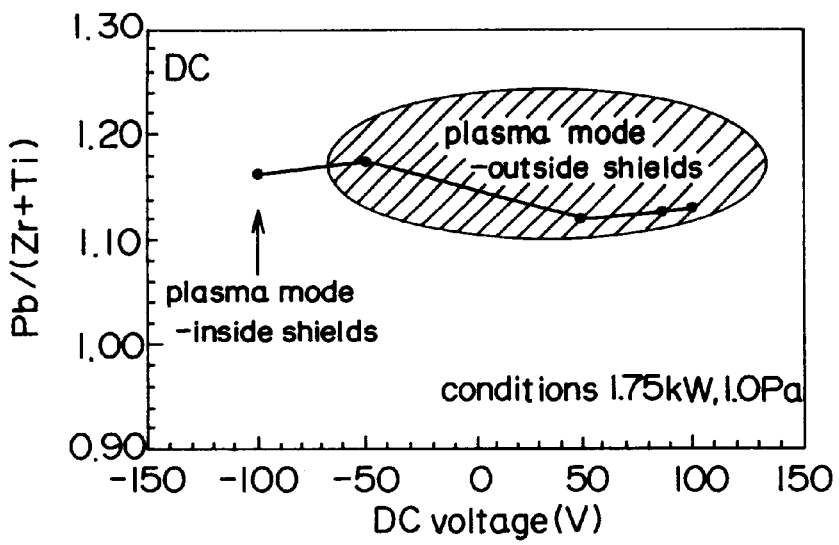
FIG. 16 is a view showing a relationship between a lead containing rate in an oxide compound and a direct current voltage applied to a shield in the RF sputtering film forming equipment according to a fifth embodiment of the present invention.

When the amount of Pb in the PLZT film has been examined while changing the DC voltage, the result shown in FIG. 16 has been derived. It has been found that the amount of Pb is not so largely changed. Likewise, it has been made clear that a mode of the plasma can be simply changed by applying the DC voltage to a part of the first shield 13. Especially, the plasma has been able to be confined in the shields 13 to 15 by applying the minus voltage.

For example, under the conditions that a pressure in the sputtering chamber into which the argon is introduced is set to 1.0 Pa, a power of the RF power supply is set to 1.75 kW, and an output voltage of the DC bias power supply 23 is set to −80 V, and composition of the target 4 and other film forming conditions are set to be identical to those in the first embodiment, the PLZT film has been grown on the semiconductor wafer W.

According to watching of the plasma in the sputtering chamber 1 during the film formation, the plasma can be confined in the first to third shields 13 to 15 and also adhesion of the film on the inner wall of the chamber 1 does not remarkably appear even if there is a clearance between the first to third shields 13 to 15 mutuallly.

As the result of that the PLZT film has been formed until the sputtering accumulated amount of 50 kWh, there has existed no foreign matter on the semiconductor wafer W and also no generation of dust has been detected in the plasma space.

In contrast, if the PLZT film is grown on the semiconductor wafer W by using the conventional equipment, i.e., the RF sputtering equipment in which the first to third adhesion preveting plates 13 to 15 are directly grounded without application of the DC bias voltage and other sputtering conditions are set similarly, it has been watched that the plasma is leaked out from the mutual clearance of the first to third adhesion preveting plates 13 to 15 and also the PLZT is adhered to the inner wall of the sputtering chamber 1. In addition, existence of the foreign matter has been watched with the eye on the semiconductor wafer W.

As described above, it has been found that, if the negative DC bias voltage is applied to a part of the first to third shields 13 to 15, a mode of the plasma can be changed and generation of dust can be suppressed.

By the way, as the result of that the pressure at the sputtering is changed from 0.5 Pa to 4.0 Pa, it has been found that the plasma is stable until 2.0 Pa and the plasma can be confined within the first to third shields 13 to 15. In case no minus voltage is applied, it has been impossible to confine the plasma in the shields at 0.5 Pa under the conditions at this time.

The above numerical values are obtained according to experimental results, but respective values do not always concide with the above numerial values according to the equipment since the discharge area is decided based on the clearance between the shields or the clearance between the shield and other jigs, and the shape of the space. However, if appropriate negative voltage is applied, it is possible to confine the plasma area in the inside of the shields. The reason for this may be believed that the ions can be attracted well to the wall by virtue of negative voltage application to thus stabilize the discharge. However, if the too large negative voltage is applied, since the discharge becomes unstable or ion imact becomes strong, material for the shield is subjected to sputter-etching and then grown on the wafer as impurity. This yields an optimal range of the applied voltage.

Figure 17:
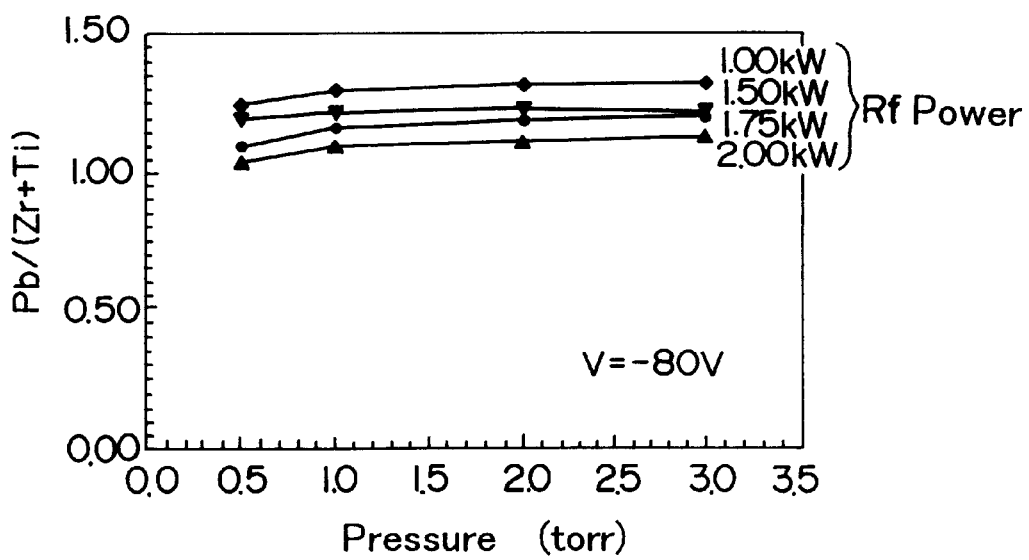
FIG. 17 is a view showing a relationship between a lead containing rate in an oxide compound and a pressure in a chamber of the RF sputtering film forming equipment according to a fifth embodiment of the present invention.

Then, when a relationship between the Pb containing rate in the PLZT film and the pressure in the chamber 1 has been checked after the DC voltage applied to the first shield 13 is set to −80 V, the result shown in FIG. 17 has been derived. In other words, it has been found that, in case the DC voltage is set to minus, the Pb content does scarcely depend on the pressure in the chamber 1, but it depends on the magnitude of the RF power applied to the target 4.

Therefore, the Pb content in the PLZT film has been checked while changing the RF power in two steps during the growth of the PLZT film.

Figure 18A:
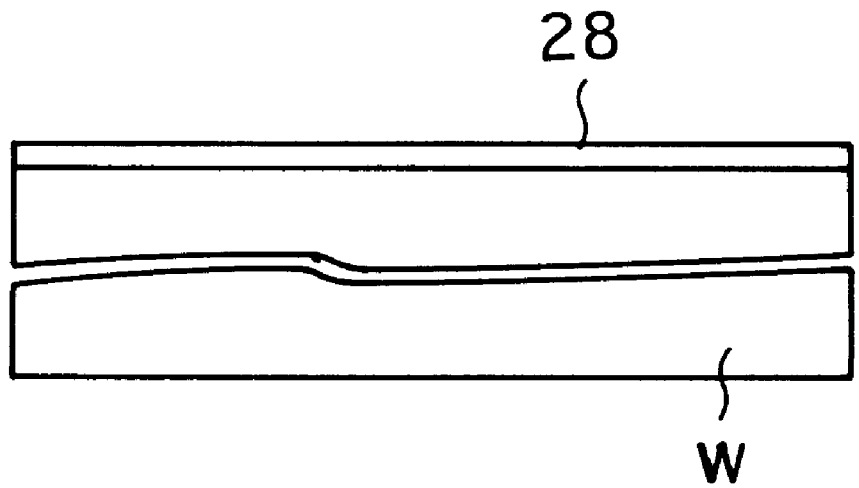
FIGS. 18A and 18B are sectional views showing formation of a lead oxide compound film which is grown by using the RF sputtering film forming equipment according to the fifth embodiment of the present invention respectively, while changing film forming conditions.

First, as shown in FIG. 18A, after the DC bias voltage of the DC bias power supply 23 is set to −80 V, the pressure in the argon atmosphere in the chamber 1 is set to 2.0 Pa, and an output of the RF power supply 5 is set to 1.0 kW, then an underlying layer 28 made of PLZT has been grown on the semiconductor wafer W until its thickness comes up to 20 nm. At that time, the Pb content in the underlying layer 28 made of PLZT has been 1.30.

Figure 18B:
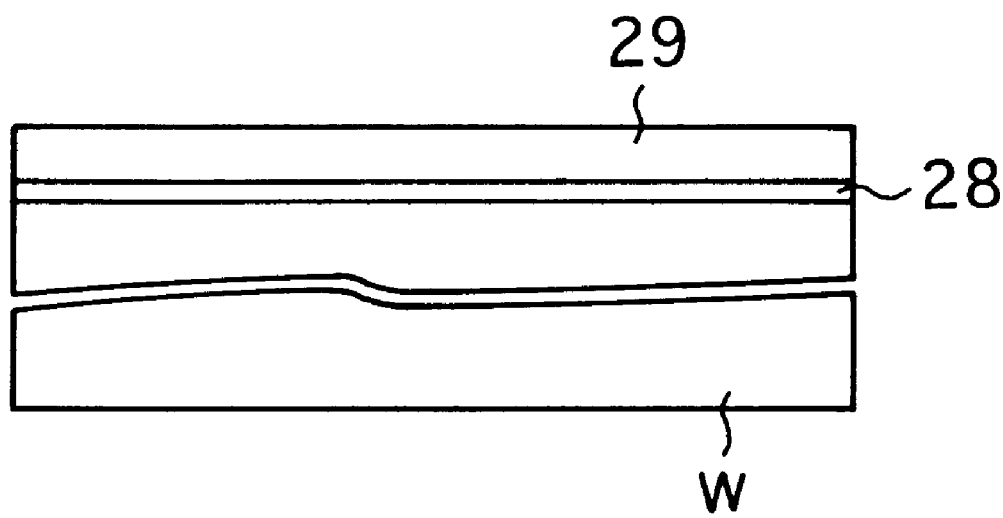

Subsequently, as shown in FIG. 18B, after the DC bias voltage of the DC bias power supply 23 is set to −80 V, the pressure in the argon atmosphere in the chamber 1 is set to 1.0 Pa, and an output of the RF power supply 5 is set to 1.75 kW, then an overlying layer 29 has been grown until its thickness comes up to 200 nm. In this case, the Pb content in the overlying layer 29 has been 1.17.

Like the above, as the result of that the film is formed until the sputtering accumulated amount reaches 50 kWh while changing the output of the RF power supply 5 in two steps, there has existed no foreign matter on the semiconductor wafer W according to the observation with the eye. In addition, according to such two-step conditions, it has been found that the plasma can be confined within the first to third shields 13 to 15 and also adhesion of the film does not remarkably appears on the wall of the chamber 1 placed outside of the plates even if there are clearances between the first to third shields 13 to 15.

With the above, it has been found that, if the negative voltage as the DC bias is applied to a part of the first to third shields 13 to 15 to change the mode of the plasma, generation of dust can be suppressed so that it is possible to get the compound film with stable composition and the arbitrary film composition control.

The above object can be achieved even if the mode of the plasma even in case the negative voltage is applied to not only a part but also all of the first to third shields 13 to 15 to change the mode of the plasma.

(Sixth Embodiment)

FRAM cell manufacturing steps by using the above film forming method and the above film forming equipment will be explained hereunder.

FIGS. 19A to 19F are sectional views showing steps of manufacturing an FRAM memory cell formed by using the RF sputtering film forming equipment according to a sixth embodiment of the present invention respectively.

First, steps required to form an n-type MOS transistor shown in FIG. 19A will be explained.

Borons are implanted into a partial area of an n-type silicon substrate 31 at the accelerating energy of 180 keV and the dosage of $1.5 \times 10^{13}$ atoms/cm$^2$. Then, impurity is diffused by placing the silicon substrate 11 in the nitrogen atmosphere at 1150° C. for 300 minutes. Thus, a p-type well 32 is formed on the silicon substrate 31.

Then, a field oxide film 33 of 500 nm thickness is formed on a (100) face of the silicon substrate 31 by the selective oxidation method. The field oxide film 33 can be formed by carrying out thermal oxidation in the atmosphere including the steam at 900° C., while covering a devide forming region on the p-type well 32 on the silicon substrate 31 with a silicon nitride mask.

After the silicon nitride mask has been removed, impurity is introduced into a channel region in the devide forming region by a predetermined amount, in order to adjust a threshold voltage of the n-type MOS transistor formed in the devide forming region. For example, boron is used as the impurity.

In turn, a surface of the silicon substrate 31 is oxidized at the temperature of 1050° C. by the argon reduced pressure oxidation method. Thereby, a gate oxide layer 34 made of $SiO_2$ is formed in the devide forming region to have a thickness of 12 nm.

Then, a polysilicon layer and a silicon oxide layer are grown by CVD. During the growth or after the growth, impurity is introduced into the polysilicon layer to thus form a conductive film. Then, stripe-like word lines WL are formed by patterning the polysilicon layer and the silicon oxide layer by means of photolithography. The word lines WL acts as gate electrodes 35 in the device forming region, and the silicon oxide layer formed on the polysilicon layer acts as protection films 36.

Then, while using the gate electrode 35 and the field oxide film 33 as a mask, phosphorus ions are implanted into the silicon substrate 31 at the acceleration energy of 20 keV and the dosage of $4 \times 10^{15}$ atoms/cm$^2$ to form a shallow impurity doped layer.

Then, after an SiO$_2$ layer of 150 nm thickness has been grown by the CVD as a whole, the SiO2 layer is etched back to remain only on side walls of the gate electrode 35 and the protection film 36. The SiO$_2$ layer remaining on the side walls is referred to as a "side wall 37".

Then, while using the gate electrode 35, the side walls 37, the protection films 36, and the field oxide film 33 as a mask, arsenic ions are implanted into the silicon substrate 31 at the acceleration energy of 70 keV and the dosage of $4 \times 10^{15}$ atoms/cm$^2$ to form a deep impurity doped layer on both outer sides of the gate electrodes 35 and the side walls 37.

After this, the shallow impurity doped layer and the deep impurity doped layer are activated by heating the silicon substrate 31 in the nitrogen atmosphere at 850° C. for 40 minutes, so that impurity diffusion layers 38s, 38d having an LDD structure respectively are formed.

Figure 19A:
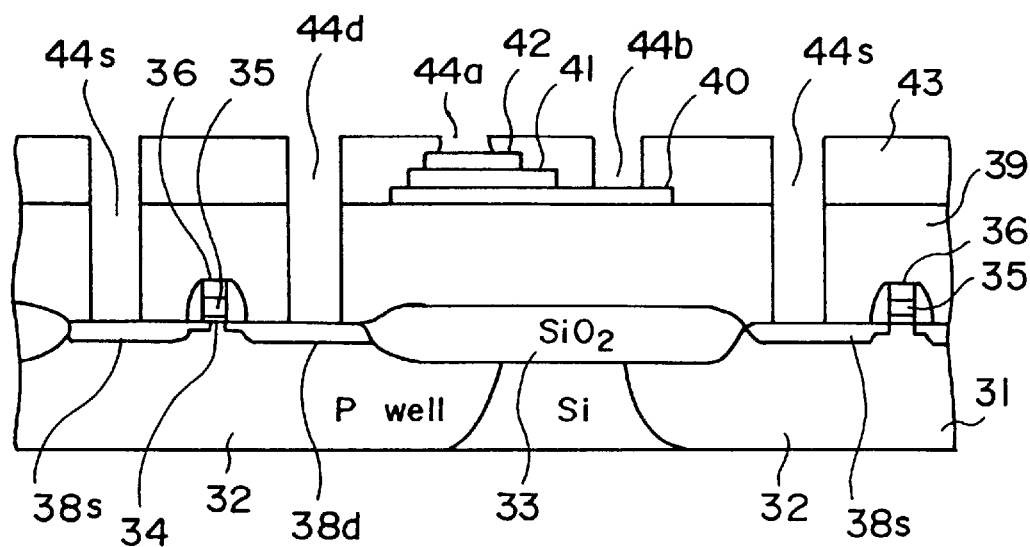
FIGS. 19A to 19F are sectional views showing respectively steps of manufacturing a semiconductor memory cell formed by using the RF sputtering film forming equipment, according to a sixth embodiment of the present invention.

A basic structure of the n-type MOS transistor shown in FIG. 19A can be formed by the above steps.

Then, a silicide film may be formed on surfaces of the impurity diffusion layers 38s, 38d which are not covered with the gate electrodes 35, and the side walls 37.

Subsequently, SiO$_2$ and BPSG as an interlayer insulating layer 39 are grown in order by the CVD to have a thickness of 50 nm and 350 nm respectively. Then, the silicon substrate 31 and respective layers formed thereon are annealed in the nitrogen atmosphere at the temperature of 850° C. for 40 minutes.

Then, iridium oxide of 50 nm thickness and platinum of 150 nm thickness are formed by the sputtering to thereby form a lower electrode 40.

In turn, a dielectric film 41 such as PZT, PLZT, or the like is formed on the lower electrode 40 by using the above sputtering film forming equipment and the above sputtering film forming method.

Then, platinum of 175 nm thickness is formed on the dielectric film 41 by the sputtering as an upper electrode 42. As a result, the state shown in FIG. 19A can be attained.

Figure 19B:
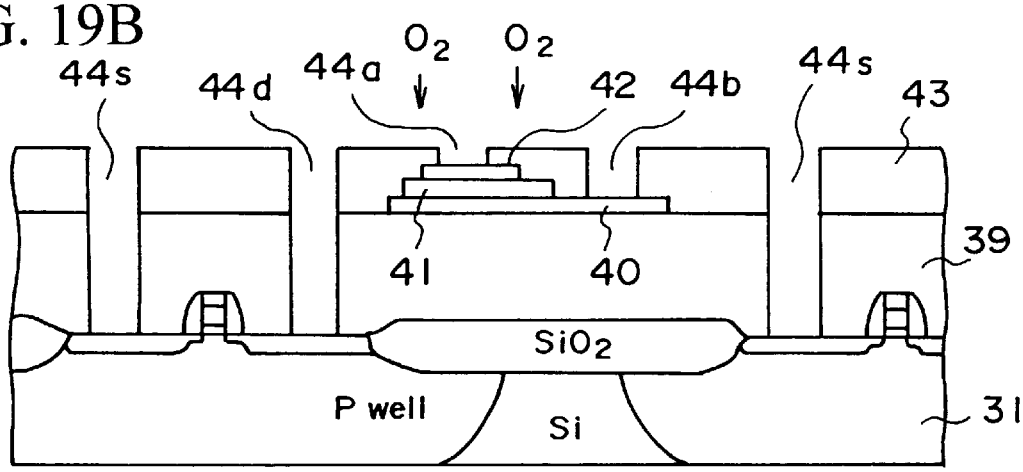

Next, as shown in FIG. 19B, the upper electrode 42, the dielectric layer 41, and the lower electrode 40 are patterned. In other words, a resist pattern is formed on the upper electrode 42, and then the upper electrode 42 is worked to have a planar shape of 50×50 $\mu$m$^2$ by plasma etching using Cl$_2$/Ar as an etchant. In addition, the dielectric layer 41 made of PZT is patterned by using another resist pattern and etching, and then a pattern of the lower electrode 40 is defined by using still another resist pattern and etching.

After these twice annealing, film quality is improved by annealing the dielectric layer 41 in the oxygen atmosphere respectively.

With the above, a basic patterning of a capacitor consisting of the upper electrode 42, the PZT dielectric layer 41, and the lower electrode 40 has been finished.

Figure 19C:
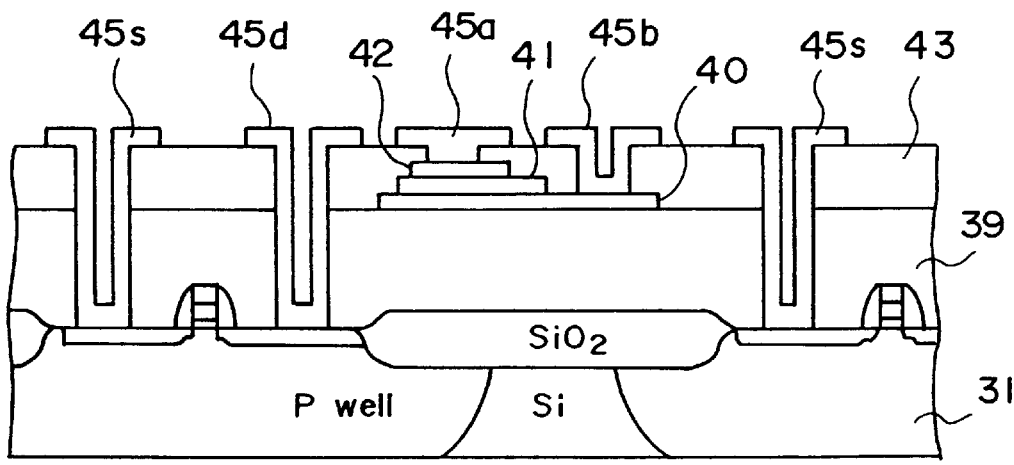

Then, as shown in FIG. 19C, a capacitor protection layer 43 made of SiO$_2$ is grown by the chemical vapor deposition method using TEOS (Tetraethoxysilane: Si(OC$_2$H$_5$)$_4$) to have a thickness of 400 nm. The capacitor protection layer 43 covers the capacitor and the n-type MOS transistor.

Figure 19D:
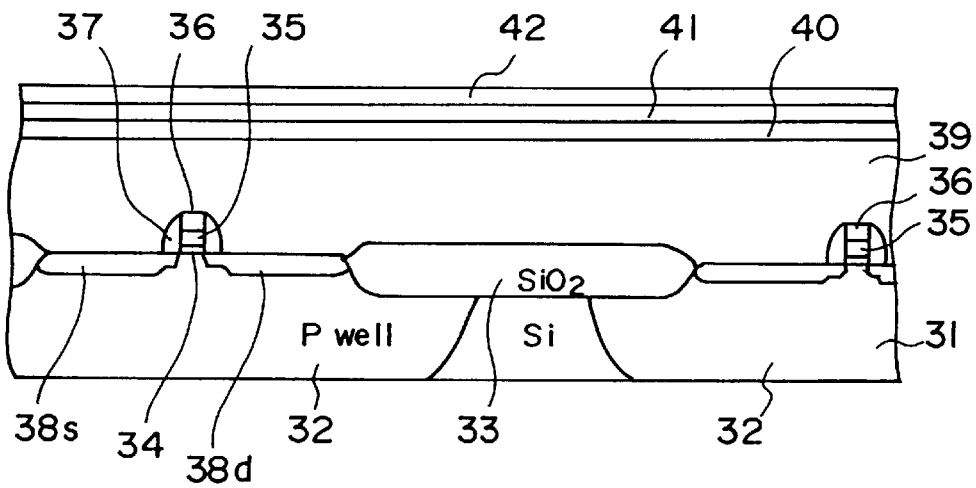

Then, as shown in FIG. 19D, the capacitor protection layer 43 and the interlayer insulating layer 39 are patterned. As a result, a first opening portion 44a, a second opening portion 44b, and third and fourth opening portions 44s, 44d can be simultaneously formed on the upper electrode 42, the lower electrode 40, and two impurity diffusion layers 38a, 38d respectively.

A gas such as CF$_4$ containing fluorine and hydrogen is employed as the etching gas for the capacitor protection layer 43 and the interlayer insulating layer 39. The plasma etching equipment is employed as the etching equipment.

Upon the growth of the capacitor protection layer 43 as above, since oxygen is reduced in both the upper electrode 42 and the dielectric layer 41 which are exposed to the reduction atmosphere to etch the capacitor protection layer 43, an amount of residual polarization charge is reduced and also the upper electrode 42 is ready to come off.

Figure 19E:
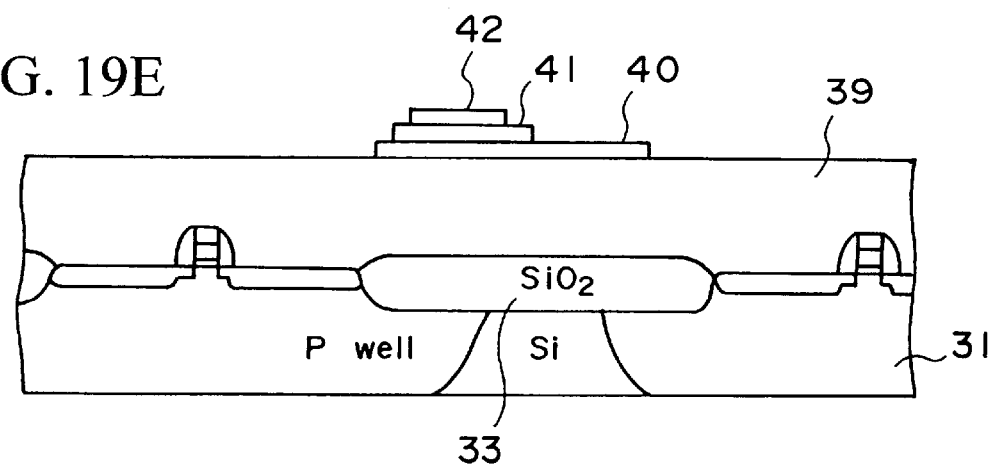

Then, after the above step of forming the openings, as shown in FIG. 19E, the capacitor is annealed in the oxygen atmosphere at the atmospheric pressure in the temperature range of 400° C. to 600° C. to thus supply the oxygen to the dielectric layer 41 and the upper electrode 42. As a result, since an amount of oxygen in the dielectric layer 41 is increased, the amount of residual polarization charge returns to an initial value and also peeling-off of the upper electrode 42 is difficult to occur.

Figure 19F:
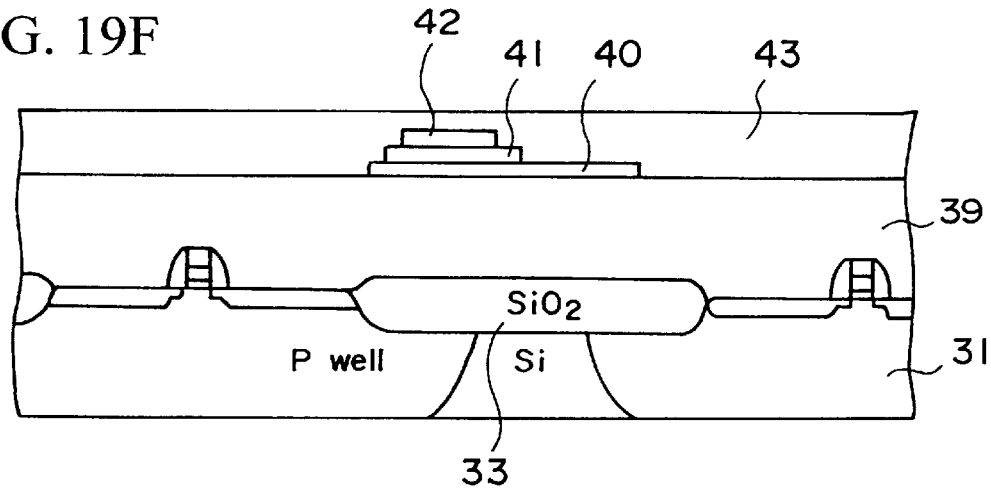

Thereafter, a Ti layer, a TiN layer, and an Al layer are formed in sequence on the SiO$_2$ protection layer 34 and in the first to fourth opening portions 44a, 44b, 44s, 44d to have a thickness of 20 nm, 50 nm, and 600 nm respectively. The Ti layer, the TiN layer, and the Al layer are patterned by the normal photolithography. As a result, as shown in FIG. 19F, a first wiring layer 45a connected to the upper electrode 42 of the capacitor via the first opening portion 44a, a second wiring layer 45b connected to the lower electrode 40 of the capacitor via the second opening portion 44b, a third wiring layer 45s connected to the impurity diffusion layer 38s via the third opening portion 44s, and a fourth wiring layer 45d connected to the impurity diffusion layer 38d via the fourth opening portion 44d are formed.

With the above, fabrication of a basic structure of the FeRAM cell has been completed.

(Other Embodiment)

In the first and second embodiments, it has been described that ①an alternating or rectangular wave is applied to a part of the wall, ② the RF power to be applied to the target is pulse-oscillated, and ③ the gas to be introduced into the chamber is changed from Ar to a gas in which He, Ne, Kr, or Xe is added, otherwise at least one type of He, Ne, Kr, and Xe is added to the argon gas.

It is needless to say that, even if only one approach is employed or plural approaches are employed in combination, these approaches are effective in improvement of the film quality.

In case the alternating or rectangular waveform is applied to a part of the shields or the wall of the chamber, a degree of contamination of the wall can be detected by monitoring a current flowing through the wall, which is available to decide a cleaning timing of the chamber. That is, since adhesion of the insulating deposition film on the wall is proceeded gradually with the sputtering, a value of the current is reduced gradually. It is possible to decide the cleaning depending on the current as a standard. Further, change in the plasma state can be caught by monitoring this current, so that the defect of the equipment can be sensed in real time.

As such a monitor, for example, as shown in FIGS. 1 and 15, there is a structure in which a current detector 25 is attached to a wiring which connects the shield 13 and the alternating power supply 20 or the DC voltage source 23 and then a value detected by the current detector 25 is displayed on a display 26.

In the fourth embodiment, a degree of contamination of the wall can be detected by monitoring a line current when the DC voltage is applied, which is useful to decide a cleaning timing of the chamber. More particularly, since the insulating deposition film is adhered to the wall with the gradual increase in the sputtering number, a value of the current is reduced gradually. It is feasible to decide the cleaning based on the value of the current. Also, change in the plasma state can be caught by monitoring this current, which can neglect the necessity that the defect of the equipment must be sensed by analyzing the formed film.

Although the sputtering method of PZT, PLZT containing Pb has been explained in detail in the above embodiments, it is needless to say that the same advantages can be achieved in other compound, for example, BST, SBT, etc. In addition, the same advantages can be achieved if the equipment for RF-sputtering by using the insulating target is employed.

As the constituting material of the wall to surround the space between the target and the susceptor externally, either conductive material or insulating material may be utilized.

As stated above, according to the present invention, since the alternating voltage or current is applied to the wall to surround the space between the target and the wafer upon growing the dielectric film by the RF sputtering, the dielectric material can be made difficult to adhere to the chamber and the wall and also the plasma in the chamber can be stabilized. Therefore, film quality of the dielectric film can be stabilized. Especially, if the dielectric film contains the lead, the lead containing amount can be easily controlled by reducing the sputtering yield of the lead.

Further, according to the present invention, since the RF power applied to the target is modulated in a pulse fashion to then generate the pulse discharge plasma in the space between the target and the wafer upon growing the dielectric film by the RF sputtering, the energy of ions implanted into the wafer can be reduced, so that composition control of the dielectric film can be made easy.

Furthermore, according to the present invention, since either the gas introduced into the chamber can be selected from helium, neon, krypton, and xenon, or the mixed gas of the selected gas and the argon gas can be employed upon growing the dielectric film by the RF sputtering, the mass of ions can be changed. Therefore, if the energy of the ions flowing into the wafer is adjusted by controlling the wafer potential, the Pb amount in the dielectric film, for example, can be controlled.

Moreover, according to the present invention, since the minus voltage is applied to the shields surrounding the space between the target and the wafer upon growing the dielectric film by the RF sputtering, the plasma generated in the space can be confined in the interior of the shields. In addition, adhesion of the dielectric material to the outside can be prevented and also generation of the dust in the plasma can be suppressed. Besides, when the plasma can be stabilized by preventing the RF current from flowing into the chamber positioned on the outside of the shields, control of the dielectric film formed on the wafer can be facilitated.

What is claimed is:

1. A sputtering film forming method comprising the steps of:
   opposing a target consisting of an insulating oxide compound material to a wafer put on a susceptor at a distance from the wafer in a chamber;
   reducing a pressure in the chamber;
   applying an RF power to the target;
   introducing a sputtering gas into the chamber; and
   depositing the insulating oxide compound material from the target to the wafer, whereby a film is formed on the wafer;
   wherein an alternating voltage is applied to a part or all of a conductive wall positioned on an outside of a space formed between the wafer and the target.

2. A sputtering film forming method according to claim 1, wherein the alternating voltage is an alternating voltage which is subjected to pulse modulation.

3. A sputtering film forming method according to claim 1, wherein a waveform of the alternating voltage is a rectangular pulse waveform.

4. A sputtering film forming method according to claim 1, wherein the sputtering gas is composed of either at least one kind of gases of helium, neon, xenon, and krypton, or a gas in which at least one kind of gases of helium, neon, xenon, and krypton is mixed selectively into an argon gas.

5. A sputtering film forming method according to claim 1, wherein the RF power is pulse-modulated.

6. A sputtering film forming method according to claim 1, wherein the film is formed of PZT, PLZT, BST, or SBT, or lead containing oxide compound.

7. A sputtering film forming method comprising the steps of:
   opposing a target to a wafer put on a susceptor at a distance from the wafer in a chamber;
   reducing a pressure in the chamber;
   generating a plasma between the wafer and the target by applying an RF power to the target;
   introducing a sputtering gas into the chamber; and
   depositing material of the target on the wafer, whereby a film is formed on the wafer;
   wherein an electron temperature in the plasma is reduced by pulse-modulating the RF power.

8. A sputtering film forming method according to claim 7, wherein the sputtering gas is composed of either at least one kind of gases of helium, neon, xenon, and krypton, or a gas in which at least one kind of gases of helium, neon, xenon, and krypton is mixed selectively into an argon gas.

9. A sputtering film forming method according to claim 9, wherein the film is formed of PZT, PLZT, BST, or SBT, or lead containing oxide compound.

10. A sputtering film forming method comprising the steps of:
    opposing a target to a wafer put on a susceptor at a distance from the wafer in a chamber;
    reducing a pressure in the chamber;
    generating a plasma between the wafer and the target by applying an RF power to the target;
    introducing a sputtering gas into the chamber; and
    depositing material of the target on the wafer, whereby a film is formed on the wafer;
    wherein the sputtering gas is composed of either at least one kind of gases of helium, neon, xenon, and krypton, or a gas in which at least one kind of gases of helium, neon, xenon, and krypton is mixed selectively into an argon gas.

11. A sputtering film forming method according to claim 10, wherein the RF power is pulse-modulated.

12. A sputtering film forming method according to claim 10, wherein the film is formed of PZT, PLZT, BST, or SBT, or lead containing oxide compound.

13. A sputtering film forming method comprising the steps of:

opposing a target to a wafer put on a susceptor at a distance from the wafer in a chamber;

reducing a pressure in the chamber;

generating a plasma between the wafer and the target by applying an RF power to the target;

introducing a sputtering gas into the chamber; and depositing material of the target on the wafer, whereby a film is formed on the wafer;

wherein a minus voltage is applied to a part or all of a conductive wall positioned around a space formed between the wafer and the target.

14. A sputtering film forming method according to claim 13, wherein the minus voltage is smaller than −50 V.

15. A sputtering film forming method according to claim 13, wherein the wafer is loaded on an electrostatic chuck which is fitted onto the susceptor and has a volume resistance of $1\times10^9$ Ωcm to $9\times10^{12}$ Ωcm.

16. A sputtering film forming method according to claim 13, wherein the film is formed of PZT, PLZT, BST, or SBT, or lead containing oxide compound.

17. A sputtering film forming method comprising the steps of:

opposing a target consisting of an insulating oxide compound material applied to a wafer put on a susceptor at a distance from the wafer in a chamber;

reducing a pressure in the chamber;

applying an RF power the target;

introducing a sputtering gas into the chamber; and depositing the insulating oxide compound material from the target to the wafer, whereby a film is formed on the wafer;

applying an alternating voltage having a frequency in a range of 50 Hz to 1 MHz to a part or all of a conducting wall positioned on an outside of a space formed between the wafer and the target.

18. A sputtering film forming method comprising the steps of:

opposing a target to a wafer put on a susceptor at a distance from the wafer in a chamber;

reducing a pressure in the chamber;

applying an RF power to the target;

introducing a sputtering gas into the chamber;

depositing material of the target to the wafer, whereby a film is formed on the wafer;

applying an alternating voltage to apart or all of the conductive wall positioned on an outside of a space formed between the wafer and the target; and detecting a cleaning time or defect of the chamber by measuring an electric current flowing through the conductive wall.

19. A sputtering film forming method comprising the steps of:

opposing a target to a wafer put on a susceptor at a distance from the wafer in a chamber;

reducing a pressure in the chamber;

generating a plasma between the wafer and the target by applying an RF power to the target;

introducing a sputtering gas into the chamber; and depositing material of the target on the wafer, whereby a film is formed on the wafer;

detecting a cleaning time or defect of the chamber by measuring an electric current flowing through the conductive wall, wherein a minus voltage is applied to a part or all of walls positioned around a space formed between the wafer and the target.

* * * * *